United States Patent
Subramanya et al.

(10) Patent No.: US 12,382,575 B2
(45) Date of Patent: Aug. 5, 2025

(54) SOLDERLESS OR GROUNDLESS ELECTROMAGNETIC SHIELDING IN ELECTRONIC DEVICES

(71) Applicant: Intel Corporation, Santa Clara, CA (US)

(72) Inventors: Bala P. Subramanya, Bangalore (IN); Prakash Kurma Raju, Bangalore (IN); Navneet K. Singh, Bangalore (IN); Sachin Bedare, Bangalore (IN); Vijith Halestoph R., Bangalore (IN)

(73) Assignee: Intel Corporation, Santa Clara, CA (US)

( * ) Notice: Subject to any disclaimer, the term of this patent is extended or adjusted under 35 U.S.C. 154(b) by 763 days.

(21) Appl. No.: 17/483,415

(22) Filed: Sep. 23, 2021

(65) Prior Publication Data
US 2022/0015273 A1  Jan. 13, 2022

(51) Int. Cl.
*H05K 9/00* (2006.01)
*H05K 1/02* (2006.01)

(52) U.S. Cl.
CPC ......... *H05K 9/0024* (2013.01); *H05K 1/0216* (2013.01)

(58) Field of Classification Search
CPC ............................ H05K 9/0024; H05K 1/0216
See application file for complete search history.

(56) References Cited

U.S. PATENT DOCUMENTS

| | | |
|---|---|---|
| 5,341,274 A | 8/1994 | Nakatani et al. |
| 5,639,989 A | 6/1997 | Higgins, III |
| 5,739,476 A * | 4/1998 | Namgung ............ H05K 3/4641 174/255 |
| 6,150,193 A | 11/2000 | Glenn |
| D522,517 S | 6/2006 | Latawiec et al. |
| 7,161,092 B2 * | 1/2007 | Glovatsky ............. B32B 15/085 174/525 |
| D627,786 S | 11/2010 | Hsia |
| 8,276,268 B2 * | 10/2012 | Kapusta ................. H05K 1/181 29/846 |
| D733,922 S | 7/2015 | Sjolander |
| D794,032 S | 8/2017 | You et al. |
| D794,033 S | 8/2017 | Park et al. |
| D801,283 S | 10/2017 | Walsh et al. |
| 9,968,014 B2 | 5/2018 | Tsai |
| 10,652,996 B2 * | 5/2020 | Chiu ...................... H05K 9/003 |
| D919,626 S | 5/2021 | Pille et al. |
| 11,528,833 B2 * | 12/2022 | Seo ...................... H05K 9/0022 |
| 2002/0185294 A1 | 12/2002 | Schlyakhtichman et al. |

(Continued)

FOREIGN PATENT DOCUMENTS

EP            3182815          6/2017

OTHER PUBLICATIONS

JP 4406484 B2; published on Jan. 27, 2010; English Translation (Year: 2010).*

(Continued)

*Primary Examiner* — Pete T Lee
(74) *Attorney, Agent, or Firm* — HANLEY, FLIGHT & ZIMMERMAN, LLC

(57) ABSTRACT

An example electronic device is disclosed that includes a printed circuit board, an electronic component coupled to the printed circuit board, and a solderless shield coupled to the printed circuit board and covering the electronic component.

25 Claims, 5 Drawing Sheets

(56) References Cited

U.S. PATENT DOCUMENTS

| | | |
|---|---|---|
| 2003/0062179 A1 | 4/2003 | West |
| 2012/0234202 A1 | 9/2012 | Tavares et al. |
| 2013/0033843 A1 | 2/2013 | Crotty, Jr. |
| 2015/0282394 A1 | 10/2015 | Yumi |
| 2016/0227679 A1 | 8/2016 | English et al. |
| 2017/0105278 A1 | 4/2017 | Cooper et al. |
| 2018/0168076 A1* | 6/2018 | Chao ................... H05K 1/028 |
| 2018/0255666 A1 | 9/2018 | Strader et al. |
| 2018/0270997 A1* | 9/2018 | Lee .................... H05K 9/0028 |
| 2020/0084921 A1 | 3/2020 | Seo et al. |
| 2020/0329592 A1 | 10/2020 | Seo et al. |

OTHER PUBLICATIONS

European Patent Office, "European Search Report," issued in connection with European Patent Application No. 22188957.9, Feb. 16, 2023, 12 pages.

MAJR Products, Date: Mar. 16, 2015, Available from internet, URL: https://www.rfmw.com/data/majr_catalog_09_final.pdf (Year: 2015), 76 pages.

European Patent Office, "Communication pursuant to Article 94(3) EPC," issued in connection with European Patent Application No. 22 188 957.9, dated Apr. 23, 2025, 9 pages.

* cited by examiner

SOLDERLESS OR GROUNDLESS ELECTROMAGNETIC SHIELDING IN ELECTRONIC DEVICES

FIELD OF THE DISCLOSURE

This disclosure relates generally to electromagnetic shielding and, more particularly, to solderless or groundless electromagnetic shielding in electronic devices.

BACKGROUND

Electromagnetic shielding is used to isolate electronic components from their surrounding environment.

Figure 1:
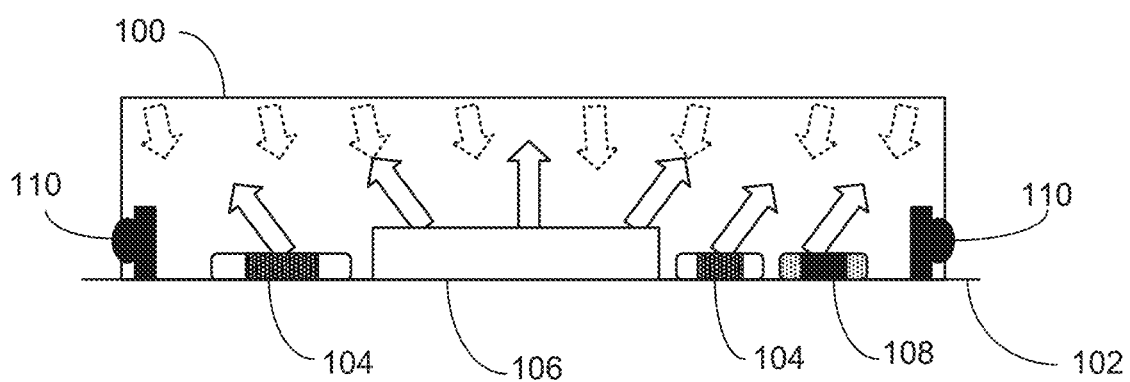
FIG. 1 is a schematic illustration of a known metal electromagnetic shield in an electronic device.

The figures are not to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular. In general, the same reference numbers will be used throughout the drawing(s) and accompanying written description to refer to the same or like parts.

DETAILED DESCRIPTION

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein, "approximately" and "about" refer to dimensions that may not be exact due to manufacturing tolerances and/or other real world imperfections. As used herein "substantially real time" refers to occurrence in a near instantaneous manner recognizing there may be real world delays for computing time, transmission, etc. Thus, unless otherwise specified, "substantially real time" refers to real time +/−1 second. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation.

As used herein, when the phrase "at least" is used as the transition term in, for example, a preamble of a claim, it is open-ended in the same manner as the term "comprising" and "including" are open ended.

The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C.

As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein.

Furthermore, although individually listed, a plurality of means, elements, or method actions may be implemented by, e.g., the same entity or object. Additionally, although individual features may be included in different examples or claims, these may possibly be combined, and the inclusion in different examples or claims does not imply that a combination of features is not feasible and/or advantageous.

Turning to the figures, FIG. 1 is a schematic illustration of a known metal electromagnetic shield 100 in an electronic device. Electromagnetic compatibility (EMC) shielding is used to reduce or prevent electromagnetic interference (EMI) and/or radio frequency interference (RFI) from impacting electronic components in an electronic device. Shields also may be used to prevent a signal from leaking out of the shield and interfering with surrounding electronic components. Shields may cover printed circuit board (PCB) elements such as, for example, integrated circuit (IC) chips, active components, and/or connectors and cables between PCBs.

The electromagnetic shield 100 in FIG. 1 is a metal cover. The electromagnetic shield 100 is coupled to a PCB 102. The electromagnetic shield 100 covers electronic components including inductors 104, an IC 106, and a capacitor 108. In some examples, the electromagnetic shield 100 covers additional and/or alternative electronic components including, for example, CPUs, GPUs, etc. The electromagnetic shield 100 is grounded to the PCB 102 via a plurality of ground connections 110. The ground connections 110 include shield pads where the electromagnetic shield 100 is soldered to the PCB 102. The electromagnetic shield 100 reflects electromagnetic and radio frequency waves. The electromagnetic shield 100 also absorbs transmitted signals, which causes a current in the electromagnetic shield 100 that is absorbed by the ground connections 110.

Electromagnetic shields that include metal covers increase the costs of the electronic device and increase the Z height (the height between the top of the PCB and the top of the completed assembly including the metal cover). Also, for dual-sided PCBs, electromagnetic shields with metal covers cannot be used because of assembly complications. In addition, the ground connections 110 used with electromagnetic shields of metal covers increase the number of PCB layers because of the requirements of high signal to ground vias and continuous ground return paths. Also, in some PCBs, soldering an electromagnetic shield leads to high yield loss because the soldering warps the PCB. The warpage may create open solder joints and areas where a base of the electromagnetic shield bridges and does not properly sit on the ground connections or soldering pads.

Figure 2:
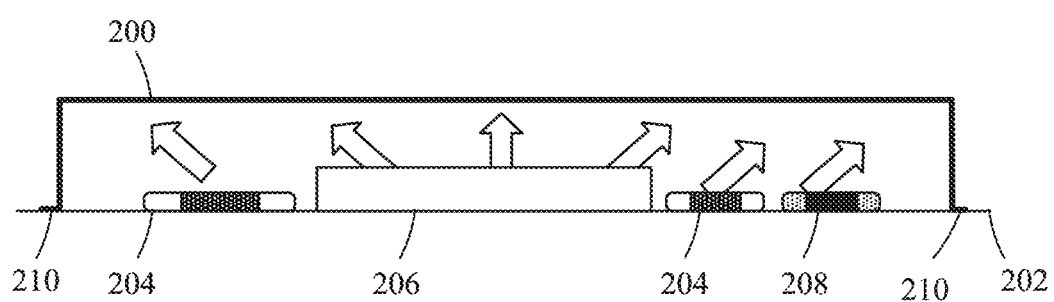
FIG. 2 is a schematic illustration of an electromagnetic shield in accordance with the teachings of this disclosure.

FIG. 2 is a schematic illustration of an example solderless electromagnetic shield 200 in accordance with the teachings of this disclosure. The electromagnetic shield 200 is coupled to an example PCB 202. The electromagnetic shield 200 covers example electronic, noise-producing, and/or heat generating components including, for example, example inductors 204, an example IC 206, and an example capacitor 208. In other examples, other types and/or number of electronic components may be covered by the electromagnetic shield 200 including, for example, a noisy power plane and/or high-speed routings. The electromagnetic shield 200 is coupled to the PCB 202 via example adhesive connections 210. The electromagnetic shield 200 absorbs electromagnetic and radio frequency waves. The electromagnetic shield 200 reduces noise.

The electromagnetic shield 200 is a flexible material. In some examples, the electromagnetic shield 200 includes graphene, graphite, and/or a combination of materials. Examples of other materials include nickel silver, copper, aluminum, stainless steel, etc. The example electromagnetic shield 200 including graphene and/or graphite has high flexibility, high EMI absorption properties, and a lower thickness than other materials such as, for example, a metal cover. The example electromagnetic shield 200 including graphene and/or graphite also has higher thermal dissipation properties than other materials such as, for example, a metal cover.

In the illustrated example, the adhesive connections 210 include acrylic-based double-sided adhesives. In other examples, other adhesive materials and/or combinations of materials may be used. The adhesive connections 210 enable the electromagnetic shield 200 to be secured to the PCB 202 without soldering or ground connections. Thus, in some examples, the electromagnetic shield 200 is solderless. In some examples, electromagnetic shield 200 is groundless where there are not ground connections between the electromagnetic shield 200 and the PCB 202. In some examples, electromagnetic shield 200 is solderless and groundless.

In examples, the electromagnetic shield 200 is positioned on a top side of the one or more electronic components covered by the electromagnetic shield 200. For example, the electromagnetic shield 200 is positioned flush with the electronic components such that there is no air gap.

Figure 3:
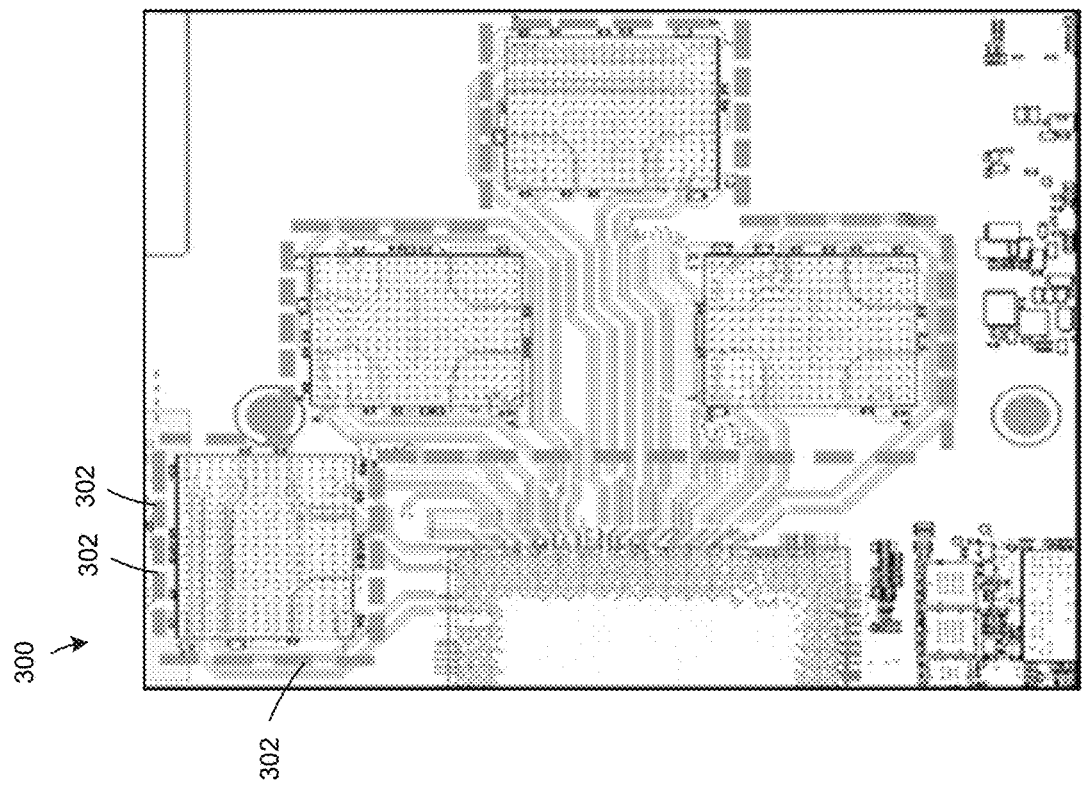
FIG. 3 is a schematic illustration of a routing layer of a printed circuit board (PCB) showing a pattern of ground pads.

FIG. 3 is a schematic illustration of a routing layer 300 of a PCB showing a pattern of ground pads 302. The metal shield ground pads 302 block routing paths. Many electronic devices include high-speed memory routing that have strict requirements of high signal to ground vias and continuous ground return paths. The requirements cannot be met when shield ground pads block portions of a routing layer. In some devices, the shield ground pads 302 puncture through one layer of a PCB, ultimately affecting routing paths in additional layers. Additional layers are needed in this situation for proper memory routing.

Figure 4:
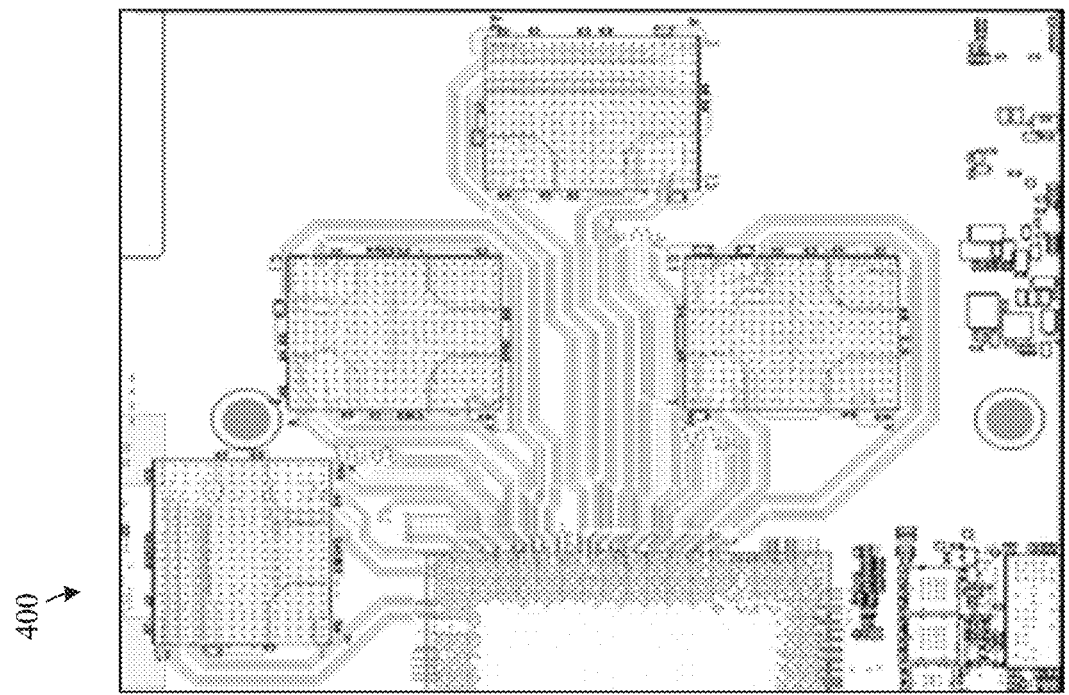
FIG. 4 is a schematic illustration of an example routing layer of an example PCB in accordance with the teachings of this disclosure.

FIG. 4 is a schematic illustration of an example routing layer 400 of an example PCB in accordance with the teachings of this disclosure. The PCB layer shown in FIG. 4 includes no shield ground pads blocking the routing. Because the layers are free from routing blockage, fewer layers are needed for proper memory routing. The solderless electromagnetic shield 200 makes it possible to efficiently utilize layers such as, for example, Layer 2 and Layer 4, for memory routing, which is not possible with metal cover shields that require shield pads. Thus, the examples disclosed herein allow the overall PCB layer counts to be reduced to, for example, an 8-layer PCB compared to metal cover shields that would need a 10-layer PCB in which Layer 3 and Layer 5 are used for memory routing. Table 1 shows an example PCB layering for a PCB with eight layers and a solderless electromagnetic shield.

TABLE 1

| Layer | Description | Transmission Line Type | Memory Routing | Non-Memory Routing |
| --- | --- | --- | --- | --- |
| Solder mask | | | | |
| 1 | Break out (BO), Power | Micro strip line | GND | BO, Power/Routing |
| Prepreg | | | | |
| 2 | Ground (GND) | GND/Power | Signal | GND/Power/BO |

TABLE 1-continued

| Layer | Description | Transmission Line Type | Memory Routing | Non-Memory Routing |
|---|---|---|---|---|
| | | Prepreg | | |
| 3 | Main Route, Power | Strip Line | GND | Main Route, Signal - 1 |
| | | Prepreg | | |
| 4 | Main Route, Power | Strip Line | Signal | GND/Power/BO |
| | | Core | | |
| 5 | GND | GND/Power | GND | GND/Power |
| | | Prepreg | | |
| 6 | Main Route, Power | Strip Line | Power | Main Route, Signal - 2 |
| | | Prepreg | | |
| 7 | GND | GND/Power | GND | GND/Power |
| | | Prepreg | | |
| 8 | BO, Power | Micro strip line | Power | BO, Power/Routing |
| | | Solder mask | | |

Figure 5:
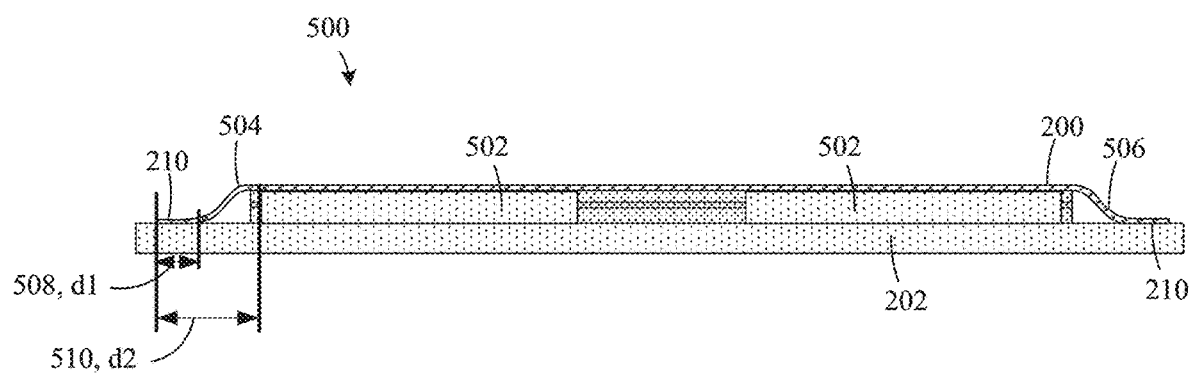
FIG. 5 is a schematic illustration of a cross-sectional view of a portion of an example electronic device with the example electromagnetic shield of FIG. 2.
Figure 6:
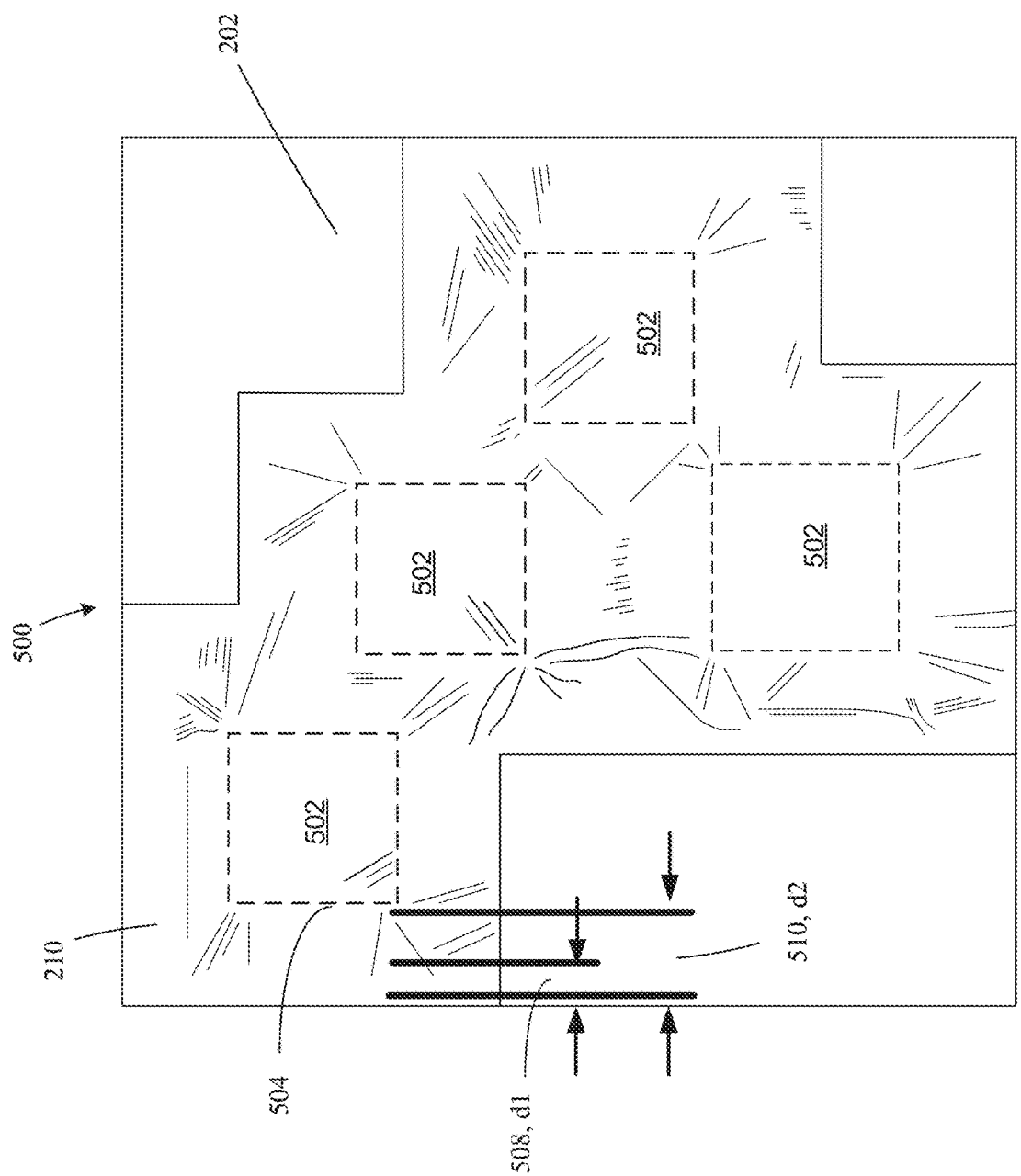
FIG. 6 is a schematic illustration of a top view of the example electronic device of FIG. 5.

FIG. 5 is a schematic illustration of a cross-sectional view of a portion of an example electronic device 500 with the example electromagnetic shield 200 in accordance with the teachings of this disclosure. In the illustrated example, the electromagnetic shield 200 covers electronic components 502. The electronic components 502 may be, for example, memory, an IC, inductors, capacitors, and/or other types of noise and/or signal producing elements. FIG. 6 is a schematic illustration of a top view of a portion of the example electronic device 500 with the example electromagnetic shield 200.

In the illustrated example, the electromagnetic shield 200 has a bend radius 504. The bend radius 504 is optimized so that the electromagnetic shield 200 does not tear when the bend radius 504 is too small, and the electromagnetic shield 200 does not consume too much PCB area when the bend radius 504 is too high. In some examples, the bend radius is 1 mm or 1 R. In other examples, the bend radius is 1.5R. In yet other examples, other radii may be used including, for example, 0.5 R, 2 R, 2.5 R, etc.

In some examples, a laminate layer 506 is included on the electromagnetic shield 200. The laminate layer 506 reinforces the electromagnetic shield 200, which prevents tearing. In some examples, the laminate layer 506 includes polyethylene terephthalate (PET). In other examples, the laminate may additionally or alternatively include a polyimide thermoplastic material such as Kapton®, a polyester film such as Mylar®, and/or other materials and/or combinations of materials. The laminate layer 506 does not affect shielding effectiveness. In some examples, the laminate layer is non-conductive. Also, in some examples, there are one or more other layers above and/or below the electromagnetic shield 200 that are non-conductive.

The electromagnetic shield 200 is adhered to the PCB 202 at the adhesive connections 210 over an example adhesive area 508. The bonding strength of the electromagnetic shield 200 is correlated to the length $d_1$ of the adhesive area 508. In some examples, $d_1$ may be about 3 millimeters (mm). In other examples, other shorter or longer lengths may be used. Also, in some examples, the adhesion thickness is about 0.038 mm. In other examples, other thicknesses may be used. In the illustrated example, the adhesion strength of the electromagnetic shield 200 incorporating graphene and/or graphite may be about 700 grams per centimeter squared (g/cm$^2$). Other strengths may be used in other examples.

The electromagnetic shield 200 includes an example shield area 510. The shield area is measured from the outer edge of the electronic component 502 and the edge of the electromagnetic shield 200 and is shown represented by $d_2$. The length $d_2$ of the shield area 510 may be based on size of the electronic components 502, geometry of the electronic components 502, the bend radius 504, the material composition of the electromagnetic shield 200, the material composition of the adhesive, the presence or absence of a laminate, etc. In the illustrated example, the length $d_2$ of the shield area 510 is about 6 mm. In other examples, other shorter or longer lengths may be used.

The electromagnetic shield 200 disclosed herein reduces the Z height of the shielding structure in an electronic device compared to known devices. The lower Z height enables the products of electronic devices such as, for example, personal computers to have increased and/or maximum performance in extremely sleek form factors. The lower Z height and overall lower form factor of the electromagnetic shield 200 enables the miniaturization of a system, reduction of a PCB area, and design of thin and light devices. The electromagnetic shield 200 also lowers production costs and production time because metal shield covers, metal shield pads, and soldering processes are not needed. Without the shield or ground pads, the electromagnetic shield 200 helps achieve target length of the memory interfaces such as, for example, less than 65 mm (package and routing on the PCB) and enables the POR speed of the memory (e.g., 6400 MTs) for an LPDDR5 solution (a low-power double data rate standard for synchronous dynamic random-access memory).

The electromagnetic shield 200 also can be implemented in new designs where traditional metal covers could not be used. For example, the electromagnetic shield 200 can be used in any application with a dual-sided PCB such as, for example, a dual-sided PCB where conventional shielding cannot be used for active components on the secondary side of the PCB due to constraints with the Z height. In some examples, an electronic device includes a dual-sided PCB, which has active (e.g., signal and/or heat generating components) on both sides of the PCB to maximize use of the footprint of the PCB area. The reduced PCB area enables a larger and/or wider battery and/or an increased number of batteries to be included in the electronic device. Thus, the electromagnetic shield 200 disclosed herein enables production of electronic devices with more power capabilities. In some examples that include dual-sided PCBs, the electromagnetic shield 200 may be a single sheet wrapped around both sides of the PCB. In other examples, the electromagnetic shield 200 may include a first sheet cover components on one side of the PCB and a second sheet covering components on the other side of the PCB.

There are many benefits observed with the electromagnetic shield 200 versus a conventional metal cover. For example, as noted above, the Z height is lower with the electromagnetic shield 200. In some examples, the Z height may be 0.2 mm less with the electromagnetic shield 200 than with a metal cover. The bill of materials also is lower with the electromagnetic shield 200. In some examples the electromagnetic shield 200 may enjoy a $0.004 per square millimeter (mm$^2$) cost advantage. The tooling costs are lower with the electromagnetic shield 200. In some examples, the tooling costs are $1 lower per system at a 100,000 volume with the electromagnetic shield 200. The PCB area is reduced with the electromagnetic shield 200. The bend radius and adhesive area require less PCB area than the shield pads and vias needed with a conventional metal cover. In some examples, approximately 200 mm$^2$ of PCB area is saved with the electromagnetic shield 200. PCB design complexity is lower with the electromagnetic shield 200 than with conventional metal covers. Conventional metal covers require shield pads punched through layers and require extra layers compared to that used with the electromagnetic shield 200. Thus, designs with the electromagnetic shield 200 enjoy PCB layer reduction. These benefits also lower design for manufacturing processes.

The assembly processes for the electromagnetic shield 200 includes die-cutting the electromagnetic shield 200 to a specified size and shape based on the application in the electronic device and the target adhesion area 508. The electromagnetic shield 200 is adhered to the target region of the PCB. Thus, material handling for the electromagnetic shield 200 is less complex than the soldering processes used with conventional metal covers.

Example apparatus and methods related to solderless and/or groundless electromagnetic shielding in electronic device are disclosed. Example 1 is an electronic device that includes a printed circuit board, an electronic component coupled to the printed circuit board, and a solderless shield coupled to the printed circuit board and covering the electronic component.

Example 2 includes the electronic device of Example 1, wherein the solderless shield includes a flexible sheet.

Example 3 includes the electronic device of Example 2, wherein the flexible sheet includes graphene.

Example 4 includes the electronic device of Examples 2 or 3, wherein the flexible sheet includes graphite.

Example 5 includes the electronic device of any of Examples 1-4, further including a laminate on the solderless shield.

Example 6 includes the electronic device of Example 5, wherein the laminate includes polyethylene terephthalate.

Example 7 includes the electronic device of any of Examples 1-6, further including an adhesive coupling the solderless shield to the printed circuit board.

Example 8 includes the electronic device of Example 7, wherein the solderless shield creates a shield area having a first length, and the adhesive couples the solderless shield to the printed circuit board over an adhesive area having second length.

Example 9 includes the electronic device of Example 8, wherein the first length is substantially equal to the second length.

Example 10 includes the electronic device of any of Examples 1-9, wherein the printed circuit board consists of eight layers.

Example 11 includes the electronic device of Example 10, further including memory routing in the second layer and the fourth layer.

Example 12 includes the electronic device of any of Examples 1-11, wherein the electronic component is a first electronic component and the electronic device includes a second electronic component coupled to the printed circuit board, the solderless shield covering the second electronic component.

Example 13 includes the electronic device of any of Examples 1-12, wherein the solderless shield is positioned on a top side of the electronic component.

Example 14 is an electronic device that includes a printed circuit board, an electronic component coupled to the printed circuit board, and a groundless shield coupled to the printed circuit board and covering the electronic component.

Example 15 includes the electronic device of Example 14, wherein the groundless shield includes a flexible sheet.

Example 16 includes the electronic device of Example 15, wherein the flexible sheet includes graphene.

Example 17 includes the electronic device of Examples 15 or 16, wherein the flexible sheet includes graphite.

Example 18 includes the electronic device of any of Examples 14-17, further including a laminate on the groundless shield.

Example 19 includes the electronic device of Example 18, wherein the laminate includes polyethylene terephthalate.

Example 20 includes the electronic device of any of Examples 14-19, further including an adhesive coupling the groundless shield to the printed circuit board.

Example 21 includes he electronic device of any of Examples 14-20, wherein the groundless shield is solderless.

Example 22 is an electronic device that includes a printed circuit board having a first side and a second side; a first electronic device coupled to the first side of the printed circuit board; a first electromagnetic shield solderlessly coupled to the first side of the printed circuit board and covering the first electronic device; a second electronic device coupled to the second side of the printed circuit board; and a second electromagnetic shield solderlessly coupled to the second side of the printed circuit board and covering the second electronic device.

Example 23 includes the electronic device of Example 22, wherein the first electromagnetic shield includes a first flexible sheet, and the second electromagnetic shield includes the first flexible sheet or a second flexible sheet.

Example 24 includes the electronic device of Examples 22 or 23, further including an adhesive to couple the first electromagnetic shield and the second electromagnetic shield to the printed circuit board.

Example 25 includes the electronic device of any of Examples 22-24, wherein the first electronic device includes a first plurality of integrated circuits, and the second electronic device includes a second plurality of integrated circuits.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

The following claims are hereby incorporated into this Detailed Description by this reference, with each claim standing on its own as a separate embodiment of the present disclosure.

What is claimed is:
1. An electronic device comprising:
a printed circuit board that consists of eight layers;
memory routing in the second layer and the fourth layer of the eight layers of the printed circuit board;
an electronic component coupled to the printed circuit board; and
a solderless shield coupled to the printed circuit board and covering the electronic component.
2. The electronic device of claim 1, wherein the solderless shield includes a flexible sheet.
3. The electronic device of claim 2, wherein the flexible sheet includes graphene.

4. The electronic device of claim 2, wherein the flexible sheet includes graphite.

5. The electronic device of claim 1, further including a laminate on the solderless shield.

6. The electronic device of claim 5, wherein the laminate includes polyethylene terephthalate.

7. The electronic device of claim 1, further including an adhesive coupling the solderless shield to the printed circuit board, the adhesive having an adhesive area of about 3 millimeters, and the solderless shield creating a shield area of about 6 millimeters from an edge of the electronic component.

8. The electronic device of claim 7, wherein the solderless shield creates a shield area having a first length, and the adhesive couples the solderless shield to the printed circuit board over an adhesive area having a second length.

9. The electronic device of claim 8, wherein the first length is substantially equal to the second length.

10. The electronic device of claim 1, wherein the electronic component is a first electronic component and the electronic device includes a second electronic component coupled to the printed circuit board, the solderless shield covering the second electronic component.

11. The electronic device of claim 1, wherein the solderless shield is positioned on a top side of the electronic component.

12. An electronic device comprising:
a printed circuit board that includes up to eight layers;
memory routing in the second layer and the fourth layer of the printed circuit board;
an electronic component coupled to the printed circuit board; and
a groundless shield coupled to the printed circuit board and covering the electronic component.

13. The electronic device of claim 12, wherein the groundless shield includes a flexible sheet.

14. The electronic device of claim 13, wherein the flexible sheet includes graphene.

15. The electronic device of claim 13, wherein the flexible sheet includes graphite.

16. The electronic device of claim 12, further including a laminate on the groundless shield.

17. The electronic device of claim 16, wherein the laminate includes polyethylene terephthalate.

18. The electronic device of claim 12, further including an adhesive coupling the groundless shield to the printed circuit board, the adhesive having a thickness of about 0.038 millimeters and an adhesion strength of about 700 grams per centimeter squared.

19. The electronic device of claim 12, wherein the groundless shield is solderless.

20. An electronic device comprising:
a printed circuit board that includes eight layers, the printed circuit board having a first side and a second side;
memory routing in the second layer and the fourth layer of the printed circuit board, the second layer and the fourth layer free of punctures for shield ground pads;
a first electronic device coupled to the first side of the printed circuit board;
a first electromagnetic shield solderlessly coupled to the first side of the printed circuit board and covering the first electronic device;
a second electronic device coupled to the second side of the printed circuit board; and
a second electromagnetic shield solderlessly coupled to the second side of the printed circuit board and covering the second electronic device.

21. The electronic device of claim 20, wherein the first electromagnetic shield includes a first flexible sheet, and the second electromagnetic shield includes the first flexible sheet or a second flexible sheet.

22. The electronic device of claim 20, further including an adhesive to couple the first electromagnetic shield and the second electromagnetic shield to the printed circuit board.

23. The electronic device of claim 20, wherein the first electronic device includes a first plurality of integrated circuits, and the second electronic device includes a second plurality of integrated circuits.

24. The electronic device of claim 1, wherein the memory routing has a length of less than 65 millimeters.

25. The electronic device of claim 1, wherein the memory routing enables a power-on-reset speed of the memory of at least 6400 megatransfers per second.

* * * * *